(12) United States Patent
Spangler

(10) Patent No.: US 11,527,224 B1
(45) Date of Patent: Dec. 13, 2022

(54) COMBINATION GUITAR HOLDER AND AMPLIFIER

(71) Applicant: Ciari Guitars, Inc., San Diego, CA (US)

(72) Inventor: Jonathan Spangler, San Diego, CA (US)

(73) Assignee: Ciari Guitars, Inc., San Diego, CA (US)

( * ) Notice: Subject to any disclaimer, the term of this patent is extended or adjusted under 35 U.S.C. 154(b) by 32 days.

(21) Appl. No.: 17/137,134

(22) Filed: Dec. 29, 2020

Related U.S. Application Data

(60) Provisional application No. 62/954,638, filed on Dec. 29, 2019.

(51) Int. Cl.
| | | |
|---|---|---|
| *G10G 5/00* | (2006.01) | |
| *G10G 7/02* | (2006.01) | |
| *H04R 3/00* | (2006.01) | |
| *H03F 3/181* | (2006.01) | |
| *G06F 3/16* | (2006.01) | |
| *H04R 1/02* | (2006.01) | |
| *H03G 3/30* | (2006.01) | |
| *F21V 33/00* | (2006.01) | |

(52) U.S. Cl.
CPC ........... *G10G 5/00* (2013.01); *F21V 33/0056* (2013.01); *G06F 3/165* (2013.01); *G10G 7/02* (2013.01); *H03F 3/181* (2013.01); *H03G 3/3005* (2013.01); *H04R 1/028* (2013.01); *H04R 3/00* (2013.01); *H03F 2200/03* (2013.01); *H03G 2201/103* (2013.01); *H04R 2201/028* (2013.01); *H04R 2420/07* (2013.01)

(58) Field of Classification Search
CPC ........ G10G 5/00; G10G 7/02; F21V 33/0056; G06F 3/165; H03F 3/181; H03F 2200/03; H03G 3/3005; H03G 2201/103; H04R 1/028; H04R 3/00; H04R 2201/028; H04R 2420/07
USPC ....................................................... 381/118
See application file for complete search history.

(56) References Cited

U.S. PATENT DOCUMENTS

| | | | |
|---|---|---|---|
| 2003/0169377 A1* | 9/2003 | Kulas .................. | G10G 7/02 349/1 |
| 2004/0255753 A1* | 12/2004 | Wilfer ................. | G10G 5/00 84/327 |
| 2011/0253655 A1* | 10/2011 | Mone .................. | G10G 5/00 211/85.6 |
| 2017/0011726 A1* | 1/2017 | Bezginas ............. | G10G 7/005 |
| 2021/0355698 A1* | 11/2021 | Spangler .............. | E04H 1/12 |

FOREIGN PATENT DOCUMENTS

WO    WO-2020240174 A1 * 12/2020 ............... G10G 5/00

\* cited by examiner

*Primary Examiner* — Vivian C Chin
*Assistant Examiner* — Friedrich Fahnert
(74) *Attorney, Agent, or Firm* — Jonathan Spangler, Esq.; Jay Bell, Esq.

(57) ABSTRACT

A guitar holder with a built-in guitar amplifier for enabling convenient guitar practice and/or play with a compact, space-saving footprint. The guitar holder may comprise any of a variety of guitar holders, including but not limited to a guitar stand and/or a guitar wall hanger.

20 Claims, 12 Drawing Sheets

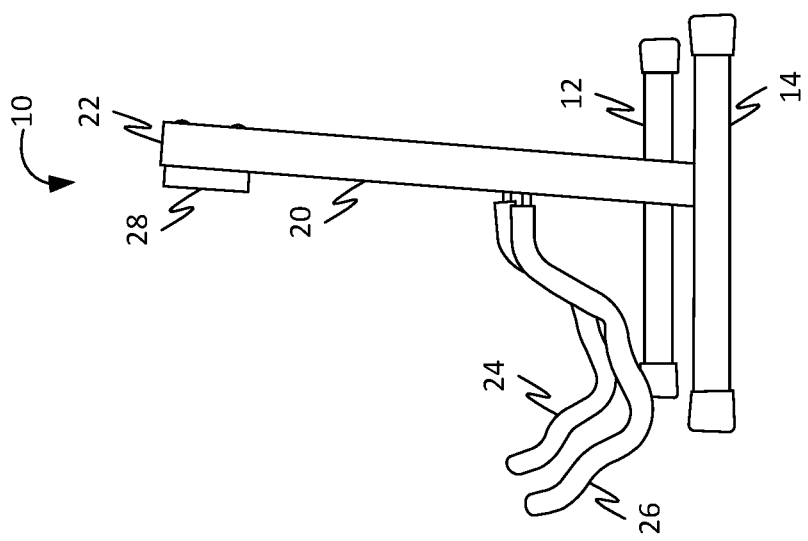
FIG. 3
Prior Art
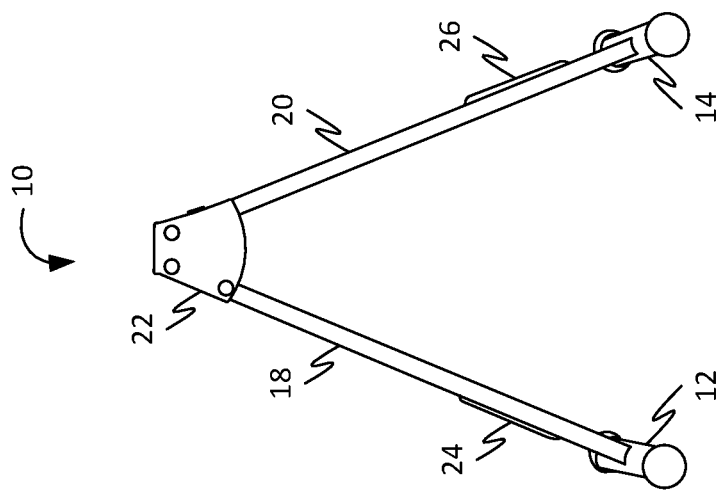
FIG. 2
Prior Art
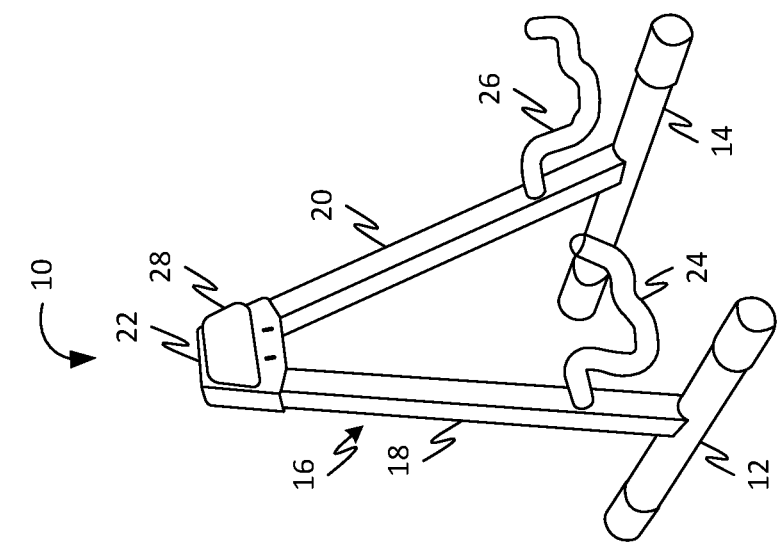
FIG. 1
Prior Art

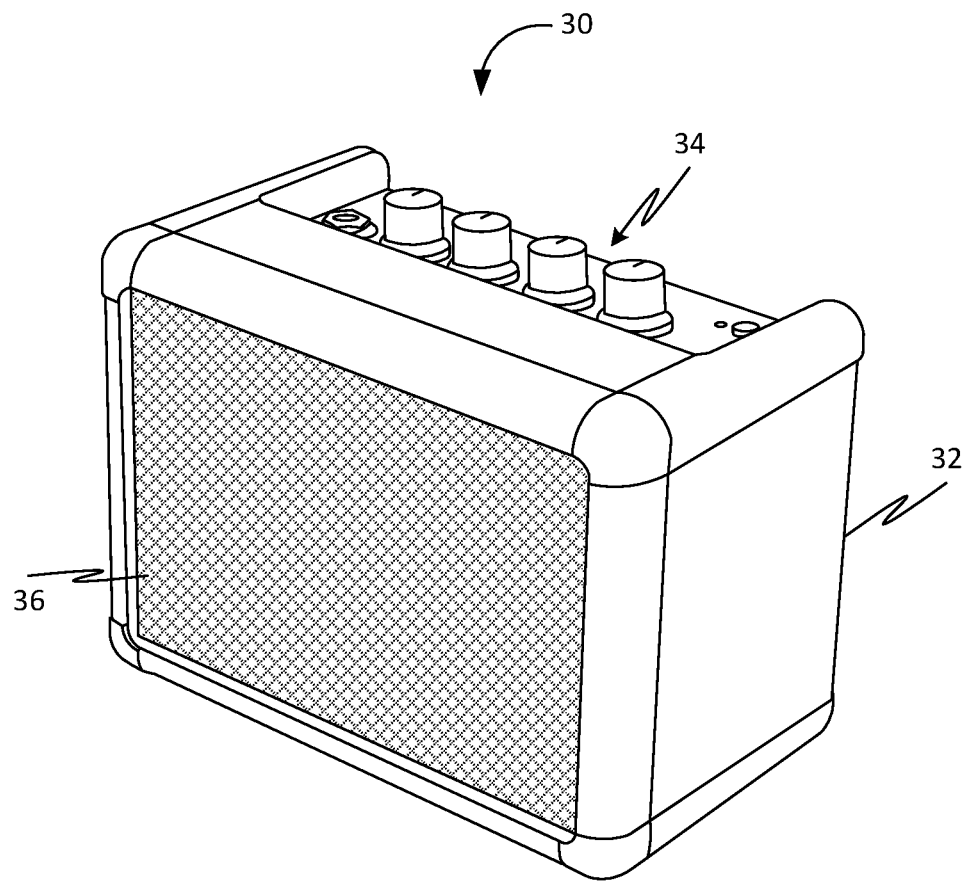
Prior Art
FIG. 4

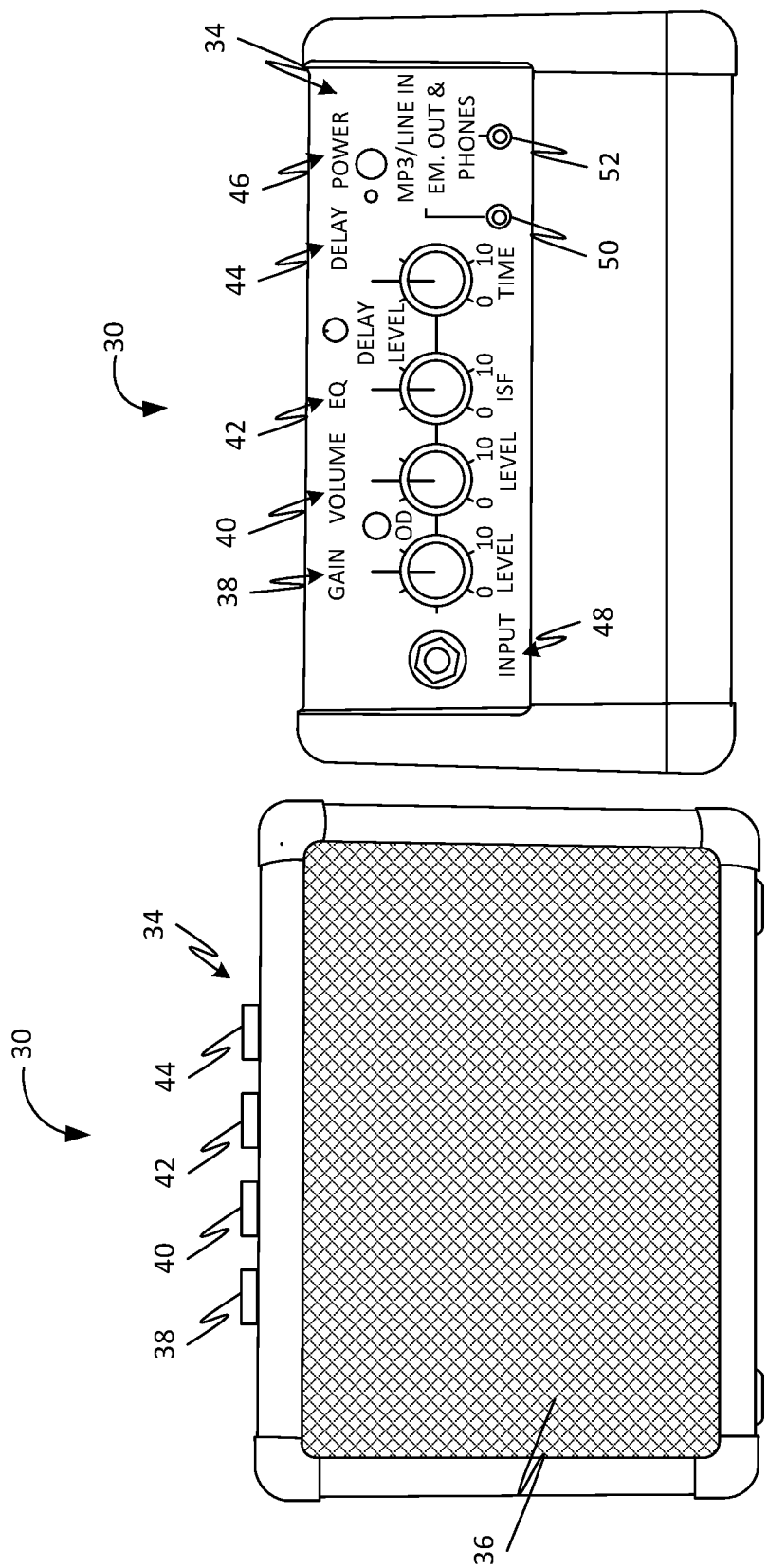
Prior Art
FIG. 6
Prior Art
FIG. 5

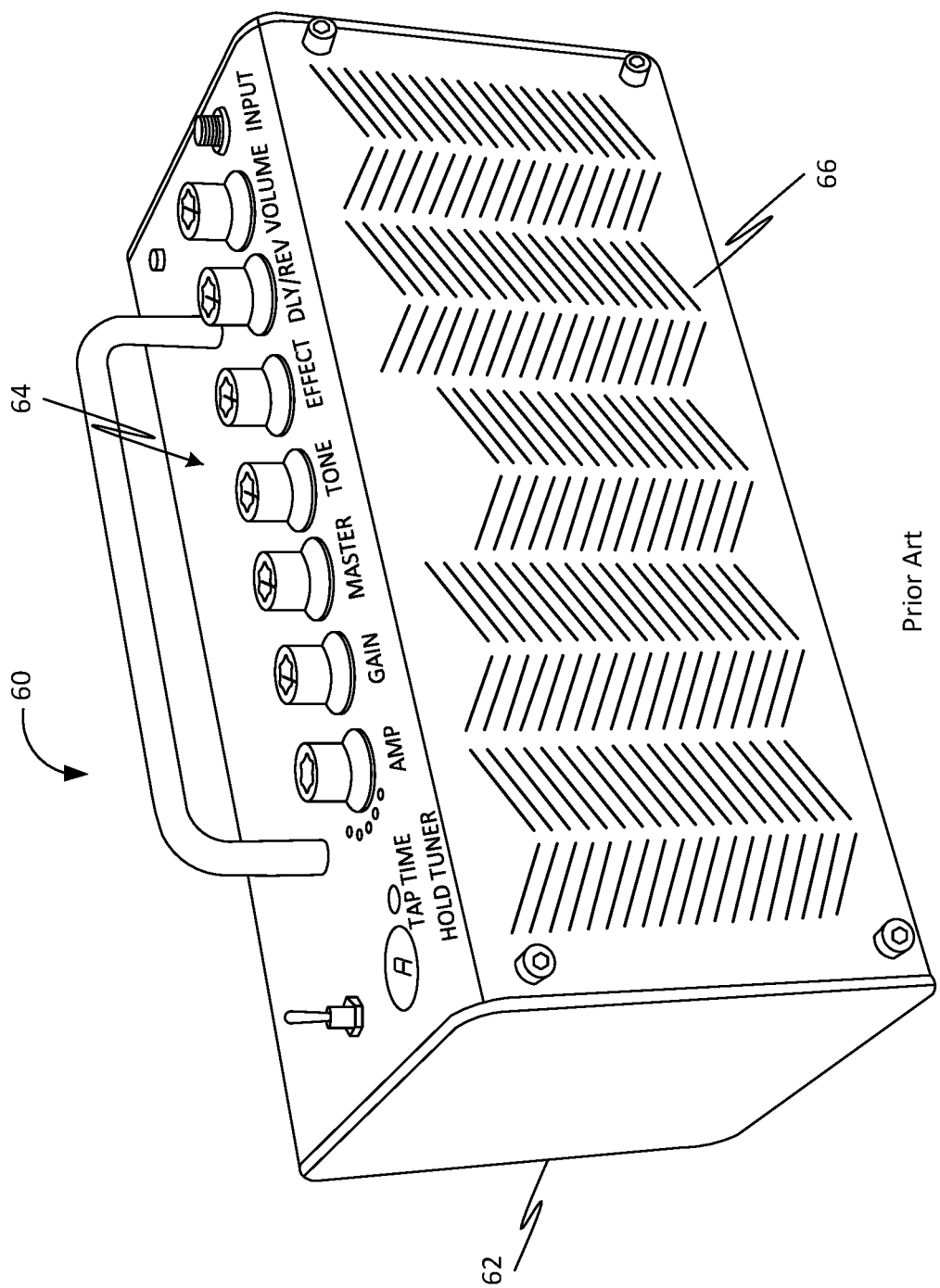
FIG. 7
Prior Art

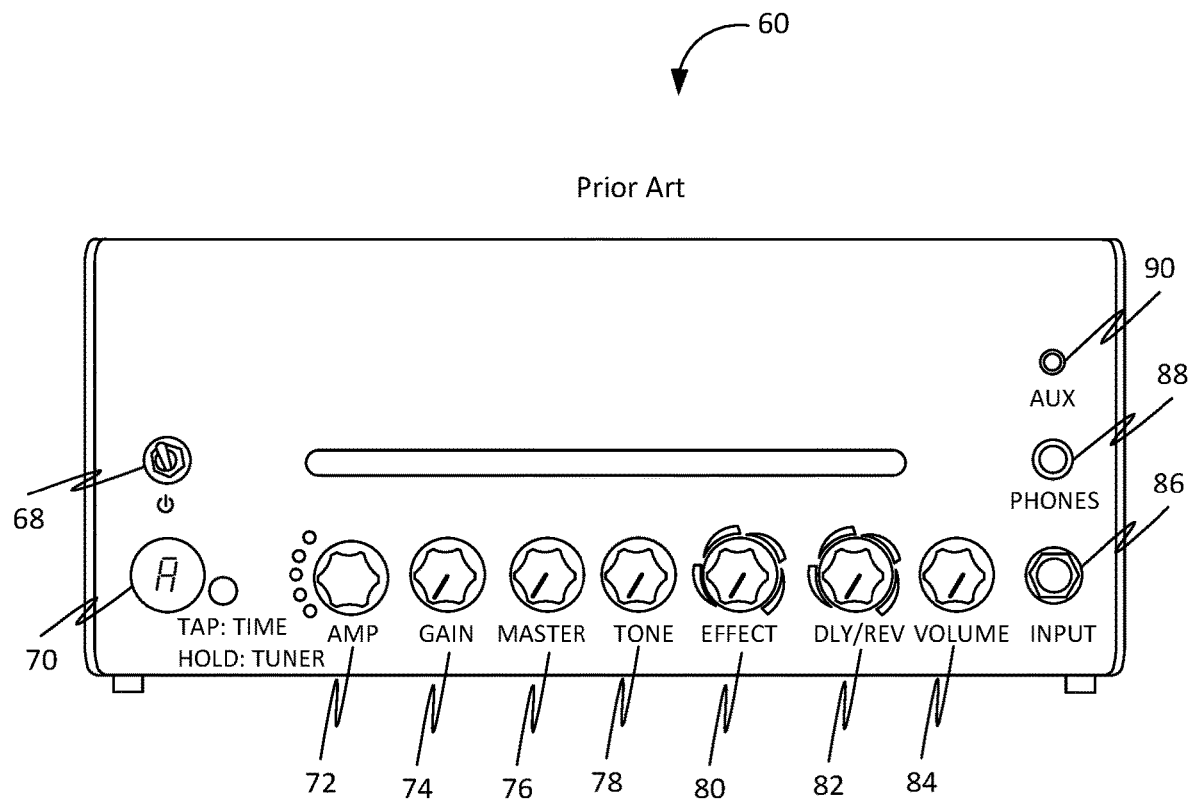
FIG. 8

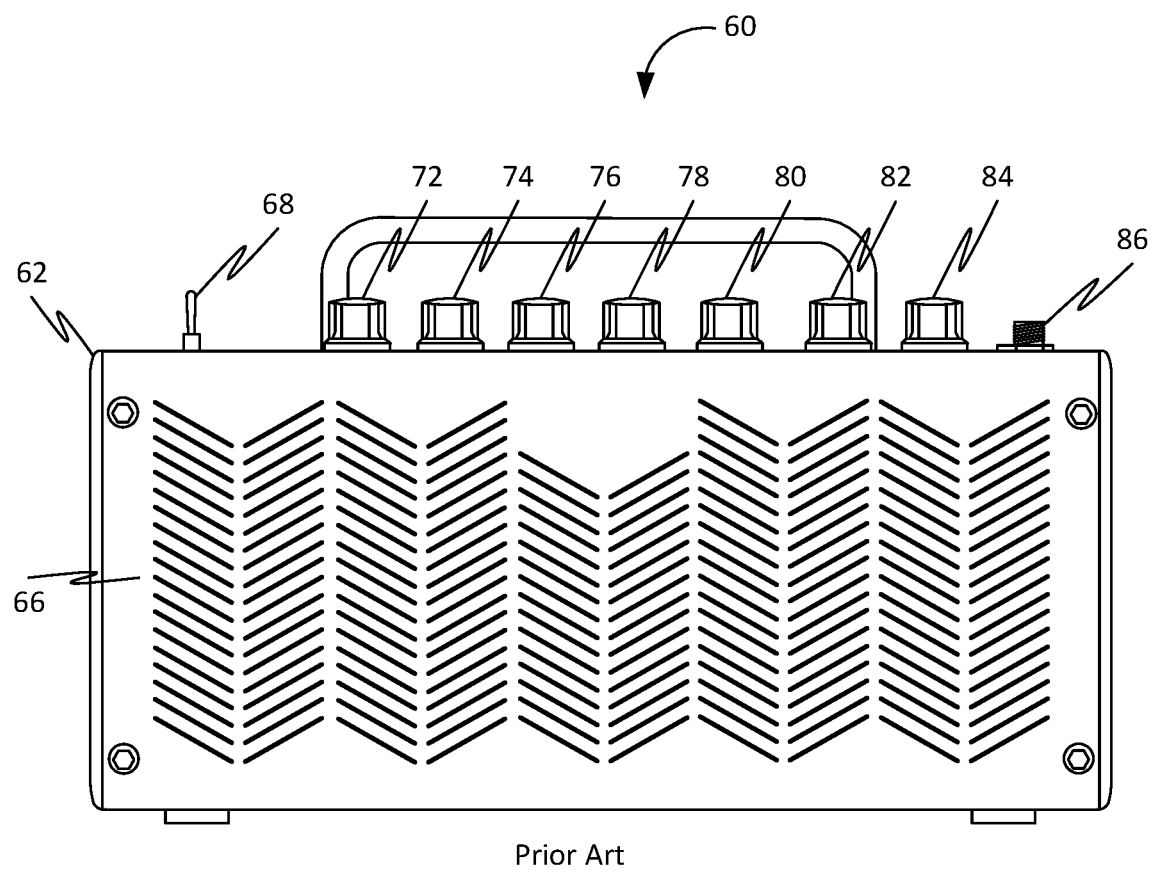
Prior Art
FIG. 9

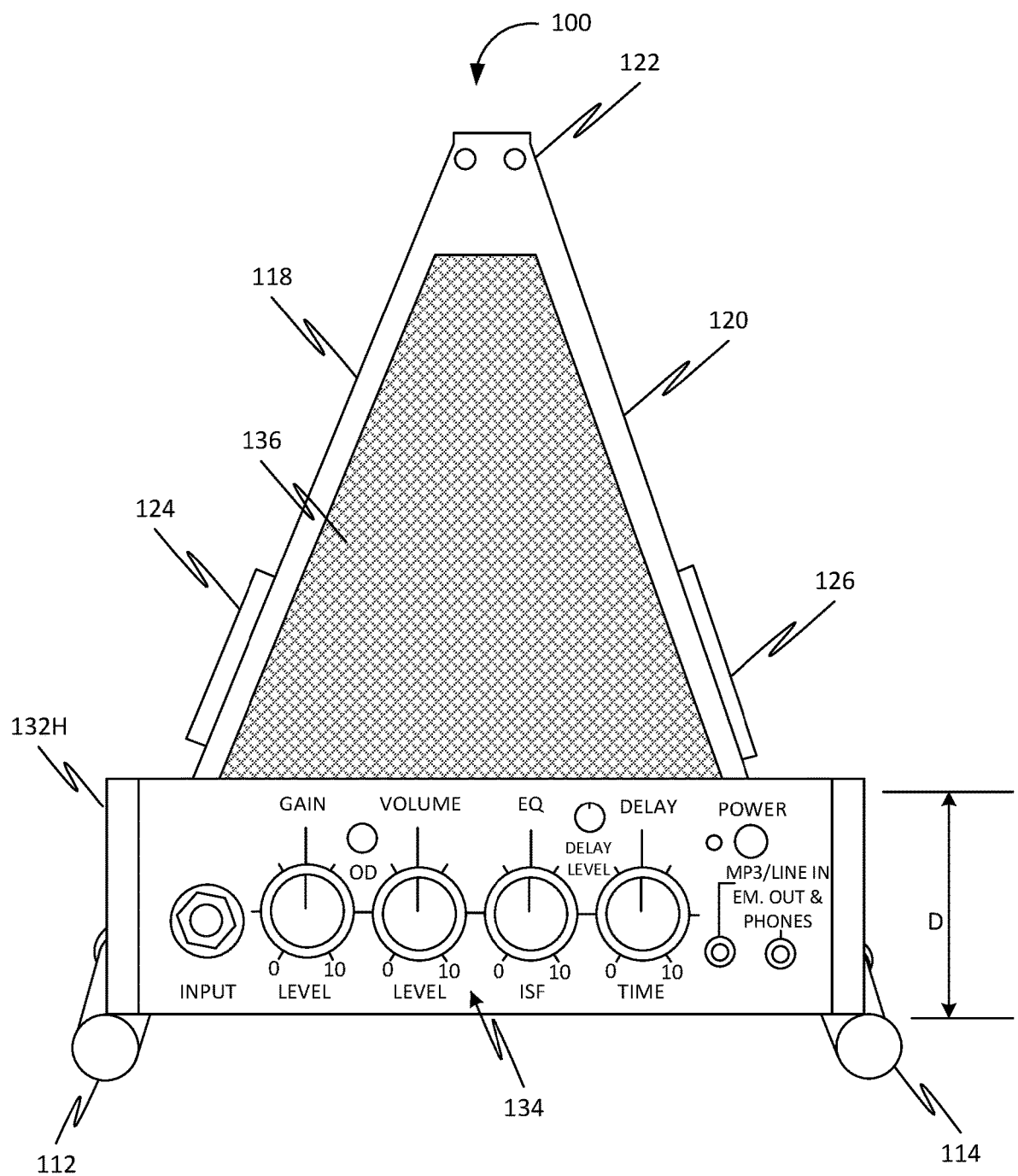
FIG. 10

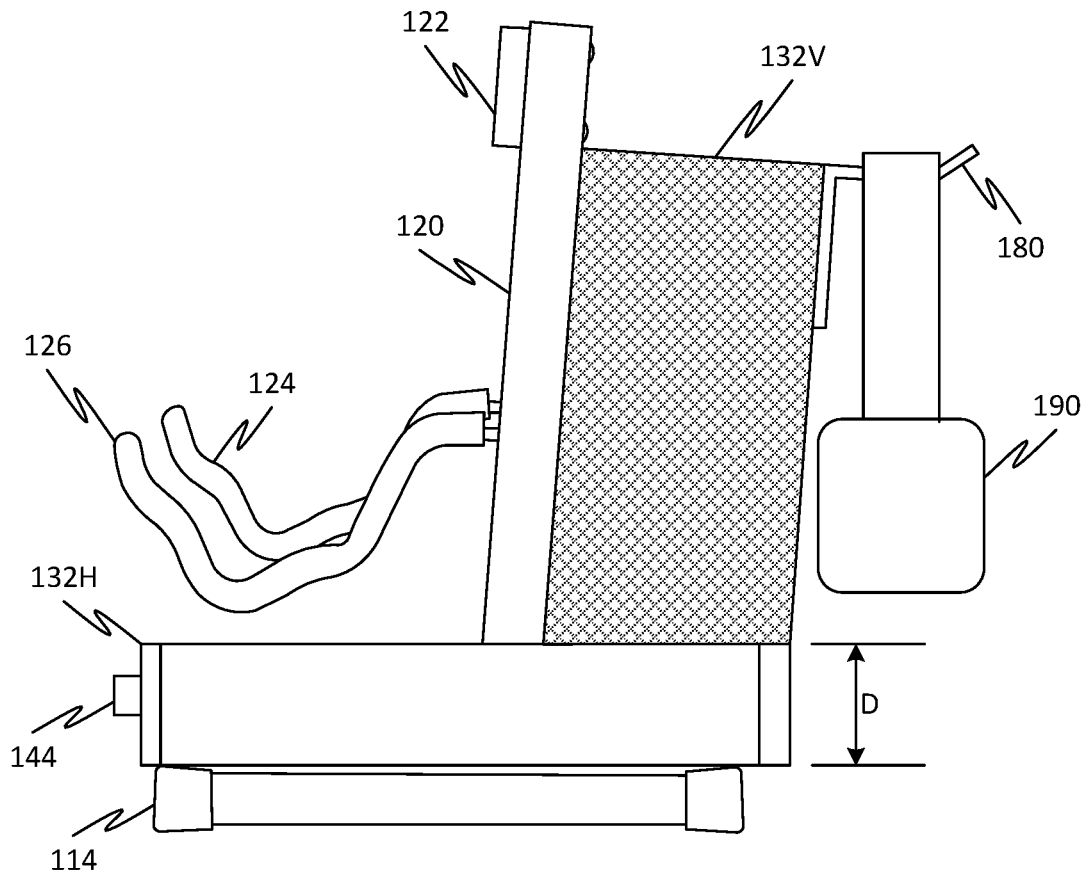
FIG. 11

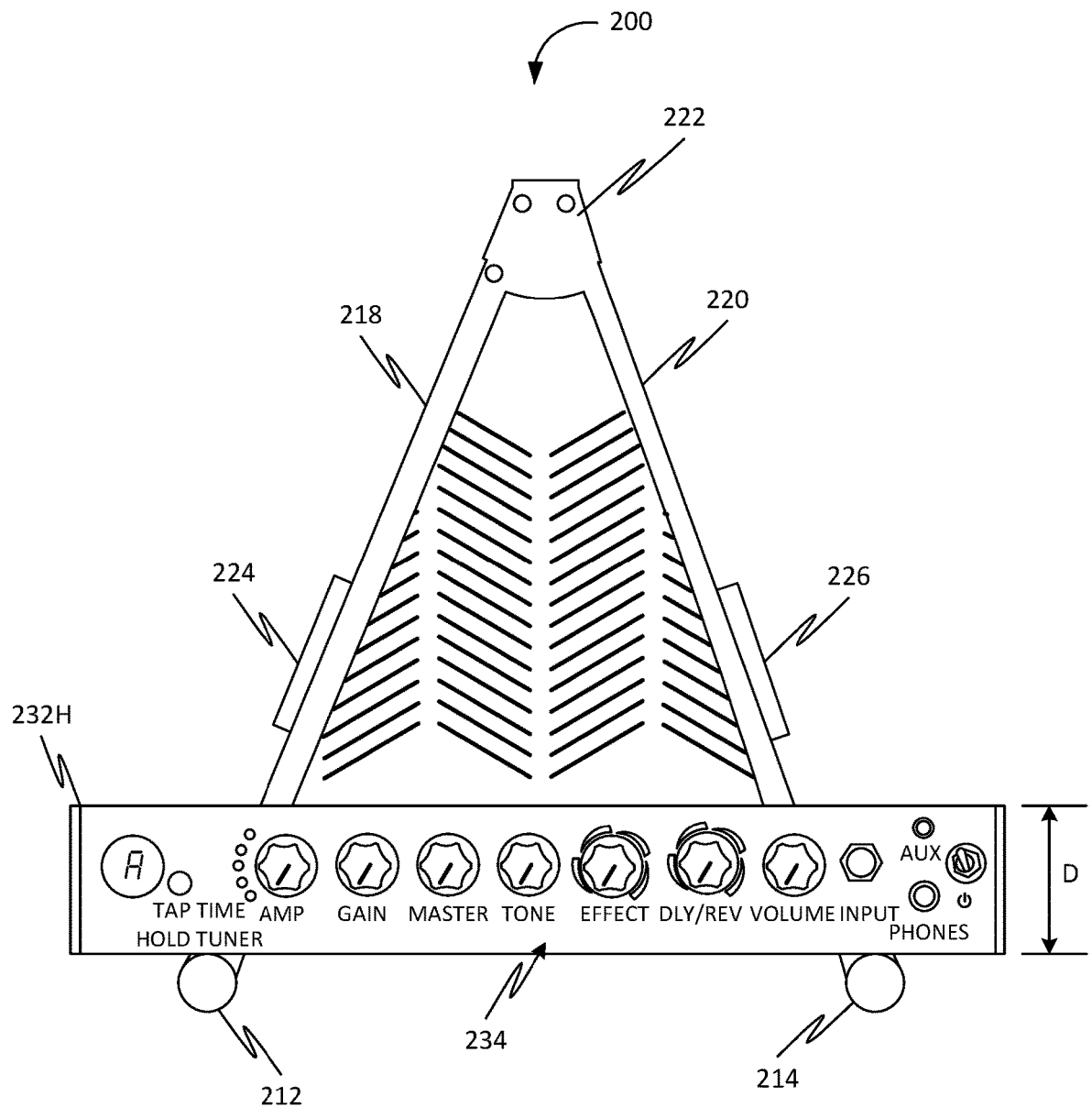
FIG. 12

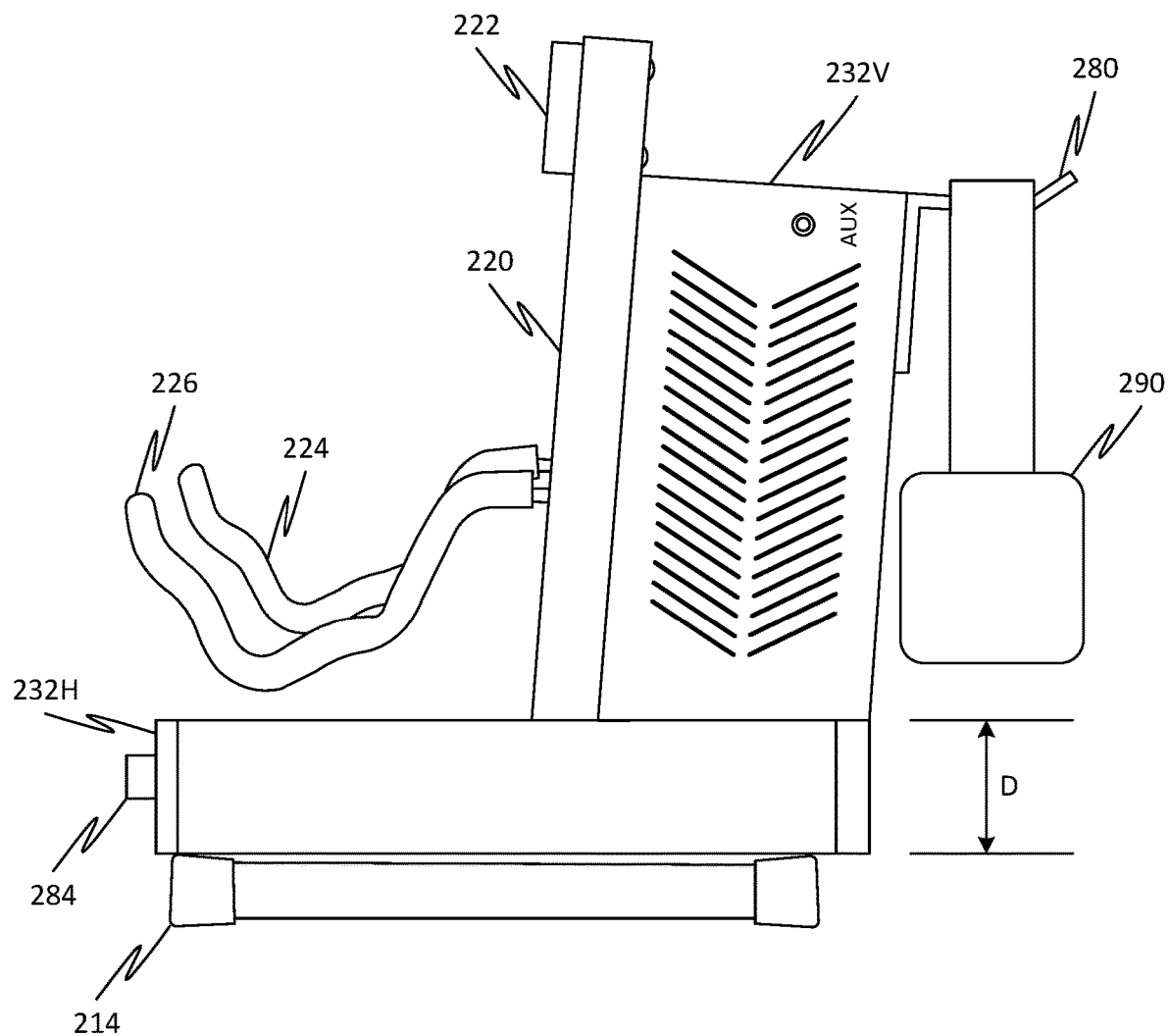
FIG. 13

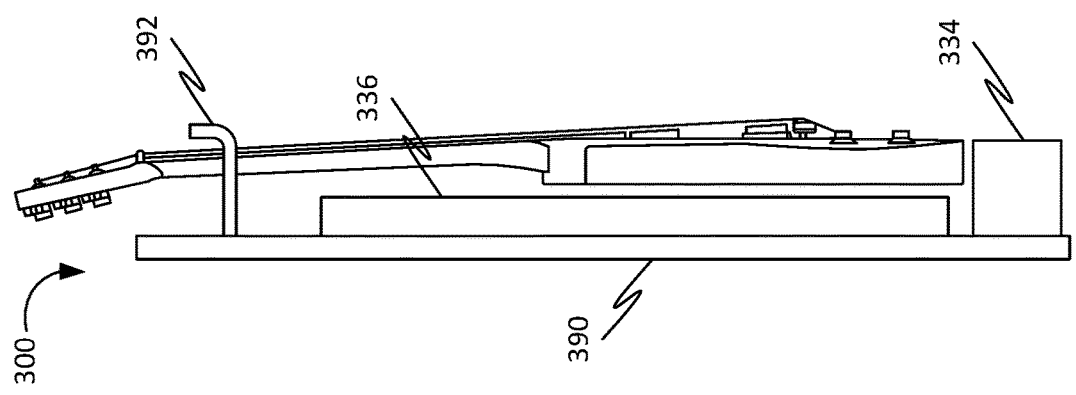
FIG. 15
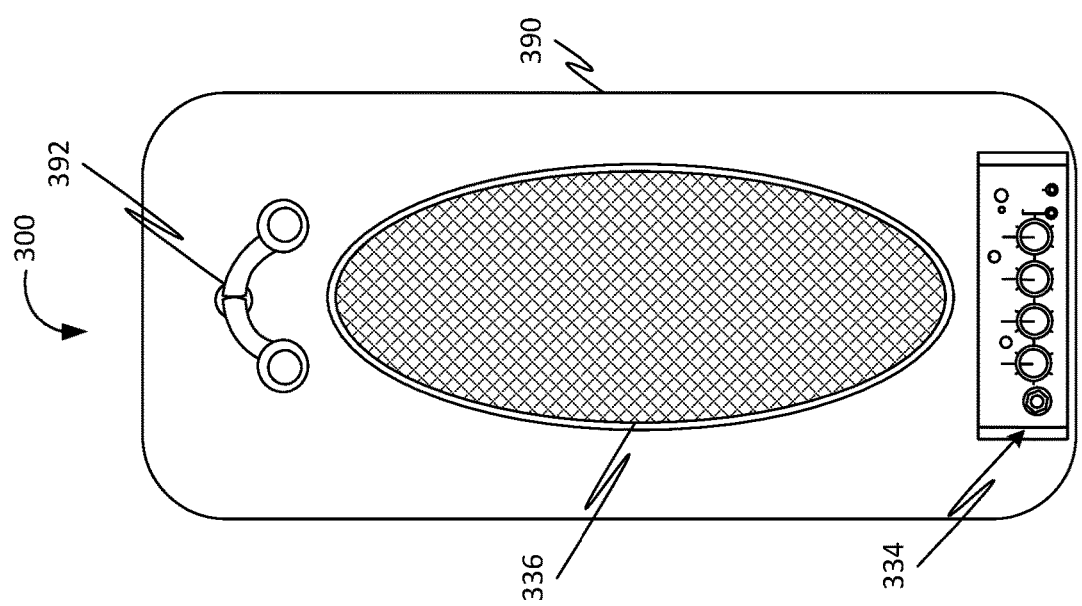
FIG. 14

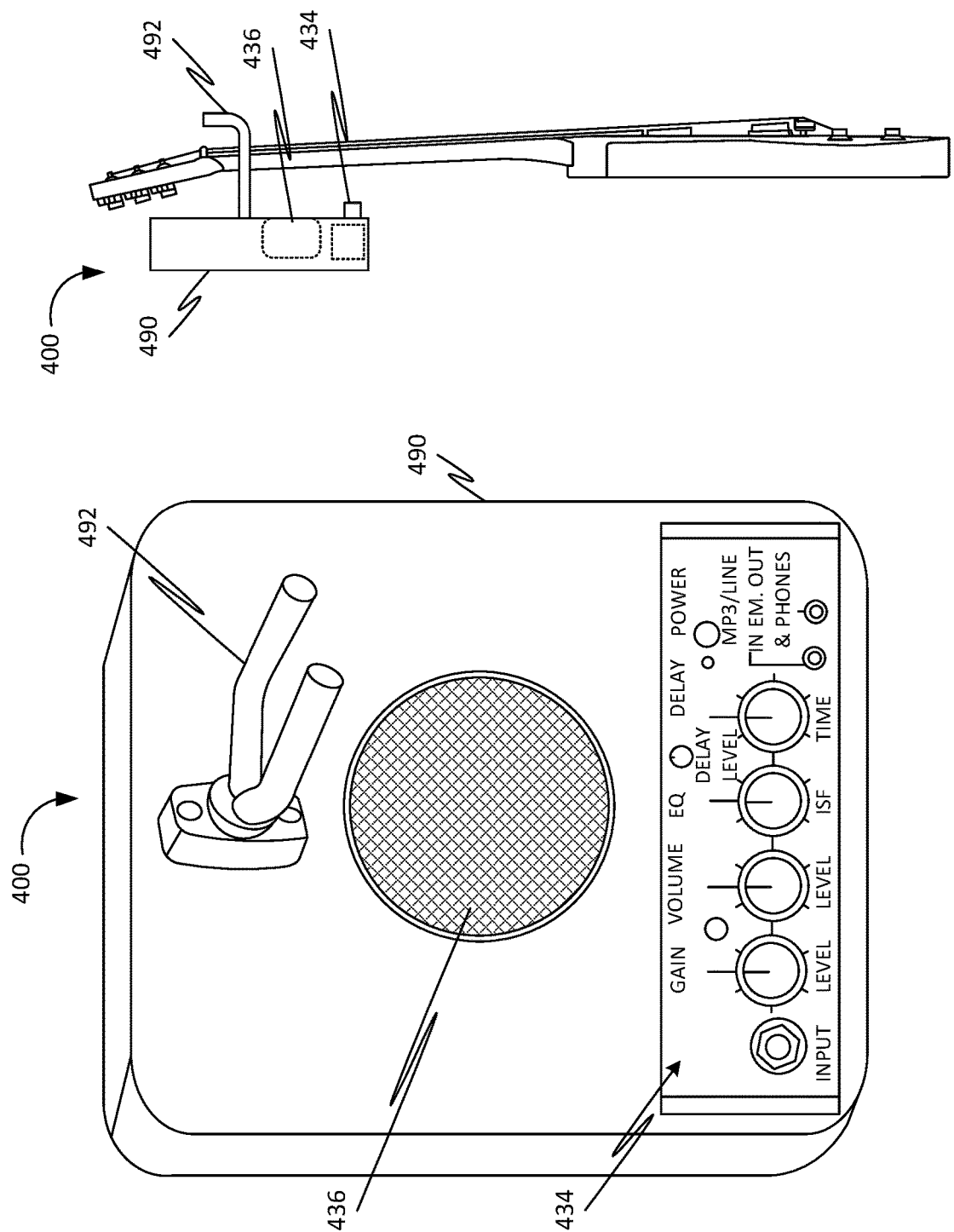
FIG. 16
FIG. 17

COMBINATION GUITAR HOLDER AND AMPLIFIER

CROSS REFERENCES TO RELATED APPLICATIONS

The present application is a US non-provisional patent application claiming priority to U.S. Provisional Patent App. Ser. No. 62/954,638 filed Dec. 29, 2019, the entire content of which is hereby expressly incorporated by reference into this disclosure as if set forth fully herein.

BACKGROUND OF THE INVENTION

I. Field of the Invention

The present invention relates generally to guitars and, more particularly, to a guitar holder (e.g. guitar stand or guitar hanger) with a built-in guitar amplifier for enabling convenient guitar practice and/or play with a compact, space-saving footprint.

II. Discussion of the Prior Art

Guitars have enjoyed among the highest popularity among musical instruments. As a function of this popularity, a variety of guitar holder (stands or wall hangers) have been developed for the purpose of holding guitars during periods of non-play, whether on-stage, at home, or even an office setting. In similar fashion, myriad amplifiers have been developed for the purpose of augmenting the sound of the guitar (for acoustic guitars) and/or converting string vibrations to audible sound (for electric guitars). To use a guitar with these prior art systems, a user must not only purchase both the guitar stand and amplifier separately, but also transport and set-up both systems separately. Beyond this underlying inconvenience, the separate use of a guitar holder and an amplifier is space-consuming insofar as they must be physically arranged next to one another. For environments with limited space (e.g. office, retail display area, etc. . . . ), this is particularly disadvantageous can lead to specific drawbacks. For an office setting, the space-consuming nature of a separate guitar holder and amplifier may cause the user to not bring the amplifier into that setting, which in turn may reduce the amount of practice/play that would otherwise occur. For a retail display setting (e.g. if the guitar stand is positioned on a countertop for customer discovery and use of the guitar), the tight space-constraints may cause an overly cluttered environment with an amplifier situated on the countertop). That, or it may be cumbersome to require retail sales personnel to pull out and plug in an amplifier when a customer expresses interest in the guitar on the stand. Given the time sensitivity on customer engagement in retail settings, any distraction or delay can be the difference between closing and losing a sale.

The present invention is focused at addressing and/or overcoming the aforementioned drawbacks of using prior art guitar holders and guitar amplifiers.

SUMMARY OF THE INVENTION

The present invention accomplishes this goal by providing a guitar holder equipped with a built-in guitar amplifier. The guitar holder may include any number of prior art guitar holders, including guitar stands having a variety of features (e.g. retractable legs, back rest, etc. . . . ), as well as guitar wall hangers. In similar fashion, the guitar amplifier may include any number of prior art guitar amplifier features (e.g. effects, distortion, microphone inputs, battery or solar-powered, etc. . . . ).

In one embodiment, the electronics and controls of the amplifier may be contained within a low-profile, generally rectangular housing dimensioned to be positioned horizontally in between the legs of the guitar stand (which stabilize the stand on a surface such as the floor, countertop, etc. . . . ) and the arms of the guitar stand (which hold the guitar during non-play). In one embodiment, the controls are positioned on the front surface of the low-profile horizontal housing, such that a user can conveniently access and operate the controls from the front of the combination guitar stand and amplifier. In one embodiment, the speaker of the guitar amplifier may be contained within a low-profile, generally rectangular housing dimensioned to be positioned generally vertically behind or along the upright of the guitar stand. When the guitar is removed from the combination guitar stand and amplifier for play or practice, the speaker will be unobstructed and thus presented for optimal audible transmission.

In another embodiment, the electronics of the amplifiers may be contained in a low-profile housing that forms part of a guitar wall hanger assembly. The wall hanger assembly includes a guitar wall hanger extending from the housing, which is dimensioned to hold a guitar in a generally vertical configuration by the headstock of the guitar. The housing includes various controls on the front surface such that a user can conveniently access and operate the controls from the front of the combination guitar holder and amplifier, as well as one or more speakers to communicate the audio associated with the guitar during use. When the guitar is removed from the combination guitar holder and amplifier for play or practice, the speaker will be unobstructed and thus presented for optimal audible transmission.

BRIEF DESCRIPTION OF THE DRAWINGS

Many advantages of the present invention will be apparent to those skilled in the art with a reading of this specification in conjunction with the attached drawings, wherein like reference numerals are applied to like elements and wherein:

FIGS. 1-3 are perspective, front and side views of a prior art guitar stand of the type for use (by way of example only) as part of the combination guitar stand and amplifier of the present invention;

FIG. 4-6 are perspective, front and top views of a prior art guitar amplifier of the type for use (by way of example only) as part of the combination guitar stand and amplifier of the present invention;

FIG. 7-9 are perspective, top, and front views of another prior art guitar amplifier of the type (by way of example only) for use as part of the combination guitar stand and amplifier of the present invention;

FIG. 10-11 are front and side views, respectively, of a combination guitar holder and amplifier according to one representative embodiment of the present invention, wherein the guitar holder comprises a guitar stand;

FIG. 12-13 are front and side views, respectively, of a combination guitar holder and amplifier according to another representative embodiment of the present invention, wherein the guitar holder comprises a guitar stand;

FIG. 14-15 are front and side views, respectively, of a combination guitar holder and amplifier according to one representative embodiment of the present invention, wherein the holder comprises a wall hanger; and FIG. 16-17 are front and side views, respectively, of a combination guitar holder and amplifier according to another representative embodiment of the present invention, wherein the holder comprises a wall hanger.

DESCRIPTION OF THE PREFERRED EMBODIMENT

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure. The combination guitar holder and guitar amplifier disclosed herein boasts a variety of inventive features and components that warrant patent protection, both individually and in combination.

FIGS. 1-3 show a prior art guitar holder, specifically in the form of a guitar stand 10, set forth by way of example only. The guitar stand 10 includes first and second legs 12, 14 and an upright 16 defined by two struts 18, 20 extending from the legs 12, 14. Struts 18, 20 intersect at a hinge 22, which allows the guitar stand 10 to be folded together (with legs 12, 14 adjacent to one another) for convenient transport and thereafter opened (with legs 12, 14 spaced apart) to hold a guitar (not shown) on arms 24, 26. The arms 24, 26 are positioned at a given vertical location along the struts 18, 20 such that the guitar may be held at a height sufficient to avoid the body of the guitar from hitting the ground. In some embodiments, the arms 24, 26 may be hingedly coupled to the struts 24, 26 such that the guitar stand 10 may be folded into general abutment with the struts 24, 26 to provide a low-profile during transport. Any number of features may be padded to protect against scratching or otherwise negatively impacting the finish of the guitar, including but not limited to foam cylinders placed on the arms 24, 26 and a foam pad 28 on the front surface of the hinge 22.

FIGS. 4-6 show a prior art guitar amplifier 30 set forth by way of example only. The amplifier 30 includes a rectangular housing 32 of unitary construction having a control panel 34 on top and a speaker panel 36 on the front surface. By way of example only, the control panel 34 includes a gain adjustment knob 38, a volume adjustment knob 40, an equalizer adjustment knob 42, a delay adjustment knob 44, a power switch 46, a ¼" input jack 48, a ⅛" input jack 50 for MP3/Line-in, and an ⅛" output jack 52 for headphones. Any number of additional knobs may be provided for adjusting or controlling other parameters or functions, including but not limited to overdrive 54 and delay level 56.

FIGS. 7-9 show a prior art guitar amplifier 60 set forth by way of example only. The amplifier 60 includes a rectangular housing 62 of unitary construction having a control panel 64 on top and a speaker panel 66 on the front surface. By way of example only, the control panel 64 includes a power switch 68, tuner display 70, amp selector knob 72, gain adjustment knob 74, a master adjustment knob 76, a tone adjustment knob 78, an effects selector knob 80, a delay/reverb adjustment knob 82, a volume adjustment knob 84, a ¼" input jack 86 for a guitar cable, an input jack 88 for headphones, and an ⅛" auxiliary jack 90 for headphones. Any number of additional knobs may be provided for adjusting or controlling other parameters or functions.

FIGS. 10-11 show a combination guitar holder and amplifier 100 according to one representative embodiment of the present invention ("combo holder/amp"). By way of example only, the combo holder/amp 100 features the same or similar guitar stand 10 as described above with reference to FIGS. 1-3 and the same or similar guitar amplifier 30 described above with reference to FIGS. 4-6. The guitar stand features of the combo holder/amp 100 share the same numbering (+100) of FIGS. 1-3 for the same or similar components but differ from the guitar stand 30 of FIGS. 1-3 in that there is an increased vertical distance (D) between the legs 112, 114 and the arms 124, 126. The amplifier features of the combo holder/amp 100 share the same numbering (+100) of FIGS. 4-6 for the same or similar components but differ from the guitar amplifier 30 of FIGS. 4-6 in that the control panel 134 and associated electronics is disposed in a generally horizontal lower housing 132H (horizontal), while the speaker 136 is disposed in a generally vertical upper housing 132V (vertical).

The lower housing 132H is a low-profile, generally rectangular structure dimensioned having a height less than the vertical distance D such that the lower housing 132H may be positioned conveniently between the legs 112, 114 and arms 124, 126. The lower housing 132H includes the control panel 134 of the amplifier 30 shown in FIGS. 4-6. In one aspect, the various knobs and features of the control panel 134 are positioned on the front surface of the low-profile horizontal housing 132H. With this positioning, a user can conveniently access and operate the controls from the front of the combo holder/amp 100. In one aspect, the vertical upper housing 132V includes one or more speaker components of the guitar amplifier 30.

Like the horizontal housing, the vertical housing 132V is a low-profile, generally rectangular housing, except it's dimensioned to be positioned generally vertically behind or along the upright 116 (adjacent to the struts 118, 120) of the guitar stand. When the guitar is removed from the combo holder/amp 100 for play or practice, the speaker section 136 will be unobstructed and thus presented for optimal audible transmission. In one aspect, the vertical housing 132V may be equipped with one or more speakers positioned along one or both sides, which will have the benefit of augmenting or increasing the audible transmission capability of the combo holder/amp 100 of the present invention.

The combo holder/amp 100 may also be equipped with one or more components for hanging and/or organizing various items, such as (but not limited to) headphones 180 and guitar cables (not shown). By way of example only, a hook 190 may be coupled to any number of suitable locations on the combo holder/amp 100 of the present invention, such as the vertical upper housing 132V. More specifically, the hook 190 is dimensioned to hang a pair of headphones 180 on the combo stand/amp 100. In this manner, the headphones 180 are conveniently stored along with the rest of the combo holder/amp 100 and yet out unobtrusively along the back side of the vertical upper housing 132V. Although not shown, it will be appreciated that any number of additional hooks may be employed for the purpose of storing and/or organizing such accessories as guitar cables, capos, extra strings, etc. . . . .

The combo guitar holder/amp 100 is advantageous in that it is easier to transport and set-up and configure than a traditional guitar stand that is separate from a traditional guitar amplifier. Beyond this underlying convenience, the combo guitar holder/amp 100 advantageously conserves space due to its shared footprint (i.e. with the guitar stand and amplifier components sharing the same horizontal footprint). For environments with limited space (e.g. office, retail display area, etc. . . . ), this is particularly advantageous. For an office setting, for example, the space-saving nature of the combo guitar stand/amp will ensure the user has both the guitar and amplifier at the ready, which in turn is likely to increase the amount of practice/play than would otherwise occur with a traditional guitar stand and traditional guitar amplifier. For a retail display setting (e.g. if the guitar stand is positioned on a countertop for customer discovery and use of the guitar), the space-saving feature will help maintain a clean and uncluttered environment while still providing an amplifier for engaging practice/play. It also eliminates the need for a retail sales personnel to pull out and plug in a separate amplifier when a customer expresses interest in the guitar on the stand, which would otherwise be required if using a traditional guitar amp. By reducing friction in the retail environment and enabling timely, uninterrupted customer engagement, more guitar sales are likely to occur than would otherwise occur if using a traditional guitar amp.

FIGS. 12-13 show a combination guitar stand and amplifier 200 according to one representative embodiment of the present invention ("combo holder/amp"). By way of example only, the combo holder/amp 200 features the same or similar guitar stand 10 as described above with reference to FIGS. 1-3 and the same or similar guitar amplifier 60 described above with reference to FIGS. 7-9. The guitar stand features of the combo holder/amp 200 share the same numbering (+200) of FIGS. 1-3 for the same or similar components but differ from the guitar stand 30 of FIGS. 1-3 in that there is an increased vertical distance (D) between the legs 212, 214 and the arms 224, 226. The amplifier features of the combo holder/amp 200 share the same numbering (+200) of FIGS. 7-9 for the same or similar components but differ from the guitar amplifier 60 of FIGS. 7-9 in that the control panel 234 and associated electronics is disposed in a generally horizontal lower housing 232H (horizontal), while the speaker section 236 is disposed in a generally vertical upper housing 232V (vertical).

The lower housing 232H is a low-profile, generally rectangular structure dimensioned having a height less than the vertical distance D such that the lower housing 232H may be positioned conveniently between the legs 212, 214 and arms 224, 226. The lower housing 232H includes the control panel 234 of the amplifier 60 shown in FIGS. 7-9. In one aspect, the various knobs and features of the control panel 234 are positioned on the front surface of the low-profile horizontal housing 232H. With this positioning, a user can conveniently access and operate the controls from the front of the combo holder/amp 200. In one aspect, the vertical housing 232V includes one or more speaker components of the guitar amplifier 60. Like the horizontal housing, the vertical housing 232V is a low-profile, generally rectangular housing, except it's dimensioned to be positioned generally vertically behind or along the upright 216 (adjacent to the struts 224, 226) of the guitar stand. When the guitar is removed from the combo holder/amp for play or practice, the speaker section 236 will be unobstructed and thus presented for optimal audible transmission. In one aspect, the vertical housing 232V may be equipped with one or more speakers positioned along one or both sides, which will have the benefit of augmenting or increasing the audible transmission capability of the combo holder/amp 200 of the present invention. The combo holder/amp 200 of FIGS. 12-13 enjoys the same benefits and advantages as the combo holder/amp 100 of FIGS. 10-11, as set forth above, as well as the added benefits from the additional controls and functionality of the guitar amp features of the combo holder/amp 200.

FIG. 14-15 show a combination guitar holder and amplifier 300 according to one representative embodiment of the present invention "(combo holder/amp"). By way of example only, the combo holder/amp 300 includes a housing 390 configured to be mounted on a wall, a guitar hanger 392 configured to hang a guitar by the headstock, and features aspects of the guitar amplifier 30 described above with reference to FIGS. 4-6. FIGS. 14-15 include the same numbering (+300) for the same or similar components of the guitar amplifier 30. The control panel 334 and associated electronics is disposed along the lower section of the housing 390 in a generally horizontal configuration, while the speaker 336 is disposed in between the control panel 334 and the guitar hanger 392.

The housing 390 is a low-profile, generally rectangular structure dimensioned to be an all-in-one guitar amplifier and guitar wall hanger. In one aspect, the various knobs and features of the control panel 334 are positioned on the front surface of the low-profile housing 390. With this positioning, a user can conveniently access and operate the controls from the front of the combo holder/amp 300. In one aspect, the housing 390 includes one or more speaker components of the guitar amplifier 30. The housing 390 is dimensioned to be positioned generally vertically behind the vertically hanging guitar when held by the combo holder/amp 300. When the guitar is removed from the combo holder/amp 300 for play or practice, the speaker section 336 will be unobstructed and thus presented for optimal audible transmission. In one aspect, the housing 390 may be equipped with one or more additional speakers, which will have the benefit of augmenting or increasing the audible transmission capability of the combo holder/amp 300 of the present invention.

According to one embodiment, the speaker(s) 336 may be any suitable technology, including but not limited to so-called flat core technology available from Resonado, Inc of South Bend, Indiana, such as disclosed one or more of U.S. Patent Publication No. 2016/0373854, U.S. Patent Publication No. 2007/0165887, U.S. Patent Publication No. 2012/0195457, U.S. Pat. No. 7,502,486 and/or U.S. Pat. No. 7,480,392 .

The combo holder/amp 300 may also be equipped with one or more components for hanging and/or organizing various items, such as (but not limited to) headphones and guitar cables (not shown) via one or more hooks coupled to or forming part of the combo holder/amp 300 of the present invention. Although not shown, it will be appreciated that any number of additional hooks or compartments may be employed for the purpose of storing and/or organizing such accessories as guitar cables, capos, extra strings, etc. . . . .

The combo guitar holder/amp 300 is advantageous in that it is easy to use and conveniently includes everything one would need to practice or play a guitar, without the need to have a wall hanger that is separate from a traditional guitar amplifier. Beyond this underlying convenience, the combo guitar holder/amp 300 advantageously conserves space due to its shared footprint (i.e. with the guitar hanger and amplifier components sharing the housing dimensioned to be wall mounted).

For environments with limited space (e.g. office, retail display area, etc. . . . ), this is particularly advantageous. For an office setting, for example, the space-saving nature of the combo guitar holder/amp will ensure the user has both the guitar and amplifier at the ready, which in turn is likely to increase the amount of practice/play than would otherwise occur with a traditional guitar hanger and traditional guitar amplifier. For a retail display setting (e.g. if the guitar hanger is positioned on a wall for customer discovery and use of the guitar), the space-saving feature will help maintain a clean and uncluttered environment while still providing an amplifier for engaging practice/play. It also eliminates the need for a retail sales personnel to pull out and plug in a separate amplifier when a customer expresses interest in the guitar on the wall hanger, which would otherwise be required if using a traditional guitar amp. By reducing friction in the retail environment and enabling timely, uninterrupted customer engagement, more guitar sales are likely to occur than would otherwise occur if using a traditional guitar amp.

FIG. 16-17 show a combination guitar holder and amplifier 400 according to one representative embodiment of the present invention "(combo holder/amp"). By way of example only, the combo holder/amp 400 includes a housing 490 configured to be mounted on a wall, a guitar hanger 492 configured to hang a guitar by the headstock, and features aspects of the guitar amplifier 30 described above with reference to FIGS. 4-6. FIGS. 14-15 include the same numbering (+400) for the same or similar components of the guitar amplifier 30. The control panel 434 and associated electronics is disposed along the lower section of the housing 490 in a generally horizontal configuration, while the speaker 436 is disposed in between the control panel 434 and the guitar hanger 492. As shown in dashed lines, the housing 490 includes the electronics associated with the control panel 434, along with the speaker 436, which creates an overall low-profile such that the guitar can be easily hung from the hanger 492 without inadvertent contact with the control panel 434 and/or the speaker 436.

The housing 490 is a low-profile, generally rectangular structure dimensioned to be an all-in-one guitar amplifier and guitar wall hanger. In one aspect, the various knobs and features of the control panel 434 are positioned on the front surface of the low-profile housing 490. With this positioning, a user can conveniently access and operate the controls from the front of the combo holder/amp 400. In one aspect, the housing 490 includes one or more speaker components of the guitar amplifier 30. The housing 490 is dimensioned to be positioned generally vertically behind the headstock and/or upper region of the neck of the vertically hanging guitar when held by the combo holder/amp 400. When the guitar is removed from the combo holder/amp 400 for play or practice, the speaker section 436 will be unobstructed and thus presented for optimal audible transmission. In one aspect, the housing 490 may be equipped with one or more additional speakers, which will have the benefit of augmenting or increasing the audible transmission capability of the combo holder/amp 400 of the present invention.

According to one embodiment, the speaker(s) 436 may be any suitable technology, including but not limited to so-called flat core technology available from Resonado, Inc of South Bend, Indiana, such as disclosed one or more of U.S. Patent Publication No. 2016/0373854, U.S. Patent Publication No. 2007/0165887, U.S. Patent Publication No. 2012/0195457, U.S. Pat. No. 7,502,486 and/or U.S. Pat. No. 7,480,392.

The combo holder/amp 400 may also be equipped with one or more components for hanging and/or organizing various items, such as (but not limited to) headphones and guitar cables (not shown) via one or more hooks coupled to or forming part of the combo holder/amp 400 of the present invention. Although not shown, it will be appreciated that any number of additional hooks or compartments may be employed for the purpose of storing and/or organizing such accessories as guitar cables, capos, extra strings, etc. . . . .

The combo guitar holder/amp 400 is advantageous in that it is easy to use and conveniently includes everything one would need to practice or play a guitar, without the need to have a wall hanger that is separate from a traditional guitar amplifier. Beyond this underlying convenience, the combo guitar holder/amp 400 advantageously conserves space due to its shared footprint (i.e. with the guitar hanger and amplifier components sharing the housing dimensioned to be wall mounted).

For environments with limited space (e.g. office, retail display area, etc. . . . ), this is particularly advantageous. For an office setting, for example, the space-saving nature of the combo guitar holder/amp will ensure the user has both the guitar and amplifier at the ready, which in turn is likely to increase the amount of practice/play than would otherwise occur with a traditional guitar hanger and traditional guitar amplifier. For a retail display setting (e.g. if the guitar hanger is positioned on a wall for customer discovery and use of the guitar), the space-saving feature will help maintain a clean and uncluttered environment while still providing an amplifier for engaging practice/play. It also eliminates the need for a retail sales personnel to pull out and plug in a separate amplifier when a customer expresses interest in the guitar on the wall hanger, which would otherwise be required if using a traditional guitar amp. By reducing friction in the retail environment and enabling timely, uninterrupted customer engagement, more guitar sales are likely to occur than would otherwise occur if using a traditional guitar amp.

The combo holder/amps of the present invention may be equipped with a variety of additional features, all of which are within the scope of the present invention. For example, the headphones could be coupled to the combo stand/amp via magnets and thus avoid the need for a separate hook. This may be accomplished by adding a magnet along an interior of the upper housing so as to magnetically couple to ferrous material in the headphone and/or magnetic component added to the headphones.

The combo holder/amps of the present invention may be WiFi and/or Bluetooth enabled for the purpose of pairing with other devices, such as smartphones, the interne, etc. . . . , to allow the user access and/or play along with songs non-resident to the combo holder/amp. The combo holder/amps of the present invention may be equipped with a display for the purpose of operating the combo holder/amps and/or practicing along with educational videos or instructional programs.

The combo holder/amps may include solar panels to capitalize on the solar energy subjected to the combo stand/amp, such as if it's near a window in an office setting or retail setting. Such captured energy may be stored via on-board circuitry and/or batteries (preferably rechargeable) and used for any of a variety of purposes, including but not limited to operating the amplifier for use.

The combo holder/amps may include wired and/or wireless functionality such that multiple instruments may be communicatively linked to the amplifier such that multiple instruments, including one or more microphones for vocals, can be routed through the amplifier.

The combo holder/amps may also include lighting features or functionality for providing backlighting behind and/or adjacent to the guitar and/or aspects of the combo stand/amp to add a pleasant aesthetic appearance or ambiance. The lighting may also be employed during use of the guitar (e.g. synchronized with the amp) to provide an augmented playing dynamic (e.g. light show), such as may be accomplished via the use of LED lights, lasers, strobes, etc. . . . .

The combo holder/amps may include one or more storage compartments dimensioned to receive and store accessories such as extra guitar strings, tuners, tools, microphones, headphones, etc. . . .

Any of the features or attributes of the above the above described embodiments and variations can be used in combination with any of the other features and attributes of the above described embodiments and variations as desired. The representative combo stand/amps set forth herein overcome or at least improve upon the disadvantages of the prior art. From the foregoing disclosure and detailed description of certain preferred embodiments, it is also apparent that various modifications, additions and other alternative embodiments are possible without departing from the true scope and spirit. The embodiments discussed were chosen and described to provide the best illustration of the principles of the present invention and its practical application to thereby enable one of ordinary skill in the art to utilize the invention in various embodiments and with various modifications as are suited to the particular use contemplated. All such modifications and variations are within the scope of the present invention as determined by the appended claims when interpreted in accordance with the benefit to which the fairly, legally, and equitably entitled.

What is claimed is:

1. A combination guitar holder and guitar amplifier, comprising:
   an assembly including a guitar holder configured to hold a guitar combined with a guitar amplifier configured to amplify a guitar, said guitar holder including a guitar stand configured to hold a body of a guitar, said guitar amplifier including a housing fixedly coupled to said guitar holder, a plurality of controls for controlling an audio output of said guitar amplifier when used with said guitar, and at least one speaker for audibly transmitting said audio output;
   wherein said guitar stand includes a pair of Legs dimensioned to contact a generally horizontal surface during use, an upright extending generally upward and angularly away from said legs, and a pair of guitar holder arms extending from said upright;
   wherein said housing includes a lower housing section and an upper housing section said lower housing section including said plurality of controls and said upper housing section including said at least one speaker; and
   wherein said lower housing section is positioned in between said pair of legs and said pair of guitar holder arms of said guitar stand, and wherein said upper housing is positioned adjacent said upright of said guitar stand.

2. The combination guitar holder and guitar amplifier of claim 1, further comprising at least one hook configured to hold at least one of a guitar cable and a pair of headphones configured to be plugged into or used with said guitar amplifier.

3. The combination guitar holder and guitar amplifier of claim 2, wherein said at least one hook is positioned along a back surface of said upper housing section.

4. The combination guitar holder and guitar amplifier of claim 1, further including at least one magnet configured to hold at least one of a guitar cable and a pair of headphones configured to be plugged into or used with said guitar amplifier.

5. The combination guitar holder and guitar amplifier of claim 1, wherein said assembly includes at least one compartment configured to hold any of a variety of guitar accessories.

6. The combination guitar holder and guitar amplifier of claim 1, wherein said guitar amplifier is configured with at least one of WiFi and Bluetooth for establishing wireless communication between said guitar amplifier and at least one of a smartphone, a computer tablet, and the internet to allow a user to at least one of access and play along with songs that are non-resident to the guitar amplifier.

7. The combination guitar holder and guitar amplifier of claim 1, further comprising a display configured to allow a user to at least one of operate said guitar amplifier and display educational or instructional programs to facilitate a user practicing along with said educational videos or instructional programs.

8. The combination guitar holder and guitar amplifier of claim 1, further comprising at least one solar panel configured to convert solar energy for the purpose of powering said guitar amplifier.

9. The combination guitar holder and guitar amplifier of claim 1, wherein said guitar amplifier includes wired or wireless functionality such that multiple instruments may be communicatively linked to said guitar amplifier.

10. The combination guitar holder and guitar amplifier of claim 1, further comprising at least one light configured to provide backlighting at least one of behind and adjacent to at least one of said guitar and aspects of said assembly.

11. The combination guitar holder and guitar amplifier of claim 10, wherein said at least one light may be at least one of synchronized with the guitar amplifier, and wherein said at least one light may include at least one of LED lights, lasers, and strobes.

12. The combination guitar holder and guitar amplifier of claim 1, wherein said guitar amplifier includes a guitar tuner.

13. The combination guitar holder and guitar amplifier of claim 1, wherein said lower housing has a height less than a vertical distance between said pair of guitar holder arms and said pair of legs of said guitar holder.

14. The combination guitar holder and guitar amplifier of claim 1, wherein said lower housing has a length approximately equal to or less than a horizontal distance between said pair of legs of said guitar holder.

15. The combination guitar holder and guitar amplifier of claim 1, wherein said lower housing has a length greater than a horizontal distance between said pair of legs of said guitar holder.

16. The combination guitar holder and guitar amplifier of claim 1, wherein a front surface of said lower housing has a generally rectangular perimeter shape.

17. The combination guitar holder and guitar amplifier of claim 1, wherein a front surface of said upper housing has a generally triangular perimeter shape.

18. The combination guitar holder and guitar amplifier of claim 1, wherein a lower surface of said lower housing of said guitar amplifier is positioned generally above said pair of legs of said guitar holder.

19. The combination guitar holder and guitar amplifier of claim 1, wherein said plurality of controls comprises at least one of volume, tone, gain, equalizer, delay, amplifier, and effect.

20. The combination guitar holder and guitar amplifier of claim 1, wherein said lower housing of said guitar amplifier includes at least one of a guitar input jack and at least one audio output jack.

* * * * *